(12) United States Patent
Yanagida (10) Patent No.: US 6,281,116 B1
(45) Date of Patent: Aug. 28, 2001

(54) METHOD OF MANUFACTURING A SEMICONDUCTOR DEVICE

(75) Inventor: Toshiharu Yanagida, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/385,958

(22) Filed: Aug. 30, 1999

(30) Foreign Application Priority Data

Sep. 7, 1998 (JP) ................................................. 10-252961

(51) Int. Cl.$^7$ ...................... H01L 21/4763; H01L 21/324
(52) U.S. Cl. ............................................. 438/637; 438/798
(58) Field of Search ..................... 438/637, 627, 438/636, 644, 638, 643, 639, 640, 618, 728, 723, 712, 740, 798, 795

(56) References Cited

U.S. PATENT DOCUMENTS

| | | | |
|---|---|---|---|
| 5,240,801 | * 8/1993 | Hayashi et al. | 430/57 |
| 5,874,355 | * 2/1999 | Huang et al. | 438/627 |
| 5,900,391 | * 5/1999 | Sakakibara et al. | 505/475 |
| 5,930,672 | * 6/1999 | Yamamoto | 438/637 |
| 5,962,347 | * 10/1999 | Takunaga et al. | 438/728 |
| 5,972,235 | * 10/1999 | Bringham et al. | 216/49 |
| 6,020,254 | * 2/2000 | Taguwa | 438/618 |
| 6,033,983 | * 3/2000 | Lee et al. | 438/637 |
| 6,037,257 | * 3/2000 | Chiang et al. | 438/687 |
| 6,051,492 | * 4/2000 | Park et al. | 438/637 |
| 6,090,718 | * 7/2000 | Soga et al. | 438/714 |

FOREIGN PATENT DOCUMENTS

06053249 * 2/1994 (JP) .............................. H01L/21/338

* cited by examiner

Primary Examiner—Trung Dang
Assistant Examiner—Brook Kebede
(74) Attorney, Agent, or Firm—Sonnenschein, Nath & Rosenthal

(57) ABSTRACT

Prior to cleaning spontaneous oxide films formed on the surface of an impurity diffusion layer or a lower layer wiring exposed at the bottom of a contact hole by sputtering by discharge plasmas with a rare gas, a dummy substrate formed with an insulation film is sputtered to deposit an insulation film on the inner wall of a plasma processing apparatus. Plasma ashing for the inner wall of the plasma processing apparatus may be used together. In this case, cleaning at higher accuracy is possible by monitoring the insulation resistance value at the inner wall of the plasma processing apparatus. Plasma processing is stabilized by always keeping the insulation resistance value high for the inner wall of the plasma processing chamber. Interconnection with low resistivity and high reliability can be attained by a fine contact hole of high aspect ratio.

6 Claims, 3 Drawing Sheets

METHOD OF MANUFACTURING A SEMICONDUCTOR DEVICE

RELATED APPLICATION DATA

The present application claims priority to Japanese Application No. P10-252961 filed Sep. 7, 1998 which application is incorporated herein by reference to the extent permitted by law.

BACKGROUND OF THE INVENTION

1. Field of the Invention

The present invention relates to a method of manufacturing a semiconductor device and more particularly to a method of manufacturing a semiconductor device having a feature in a pretreatment step before entering a step o forming an upper conduction layer (metallization) in interconnection for a multilayered wiring structure of a highly integrated semiconductor device.

2. Description of Related Art

As integration degree of semiconductor devices such as in ULSI (Ultra Large Scale Integrated Circuits) has been increased and a design rule therefor has been refined, a multilayered wiring structure has been used frequently. In the multilayered wiring structure, a lower conduction layer and an upper conduction layer are electrically connected by way of a contact hole formed in the an interlayer insulation film. The size of the contact hole has also become finer and the opened diameter of a contact hole is about 0.24 $\mu$m, for example, in a semiconductor device with a minimum design rule of 0.18 $\mu$m. Since the thickness of the interlayer insulation film itself is about 10 $\mu$m in view of an inter-wiring capacity and a withstand voltage, the aspect ratio of the contact hole reaches 4 or more.

For attaining a multilayered wiring structure of low resistivity and high reliability with a fine contact hole of high aspect ratio, it is indispensable for a pretreatment step of removing spontaneous oxide films and contaminants (hereinafter simply referred to as spontaneous oxide films) formed inevitably on the surface of the lower layer conduction layer exposed to the bottom of the contact hole, that is, a cleaning step.

The spontaneous oxide films on the surface of an impurity diffusion layer exposed at the bottom of a connection holes facing an impurity diffusion layer of a semiconductor substrate, for example, made of silicon as a lower conduction layer, that is, a contact hole mainly comprise silicon oxide and also contain etching residues, resist residues or adsorbed moisture. For removing the spontaneous oxide films, wet cleaning using an aqueous solution of diluted hydrofluoric acid has mainly been used so far. However, since the interlayer insulation film on the side wall of the contact hole is also etched isotropically to form an overhung shape, this gives rise to a problem of worsening the fillage of the contact plug or the upper layer wiring.

Further, in a contact hole having a fine opening diameter and a high aspect ratio, since a cleaning solution does not completely prevail as far as the inside of the contact hole, it gives rise to a problem of lowering the effect of removing spontaneous oxide films at the bottom of the contact hole.

Instead of the cleaning, dry cleaning using an adverse sputtering with $Ar^+$ ions has been proposed and put to practical use for the pretreatment of via contact holes facing the lower layer wiring such as of Al series metal as the lower conduction layer. Since $Ar^+$ ions can be controlled for the directionality by an electric field or the like, oxide films can be removed easily also from the bottom of a fine contact hole of high aspect ratio. However, upon removal of spontaneous oxide films on the surface of a lower layer wiring extended from the gate electrode, it has been pointed out a problem that gate insulation film suffers from destruction due to accumulation of charges by incident $Ar^+$ ions.

Further, when the lower conduction layer is a shallow impurity diffusion layer formed to a semiconductor substrate, junction leakage may possibly be caused by damages due to incidence of $Ar^+$ ions at a high ion energy.

In view of the above, the present inventors has already disclosed in Japanese Published Unexamined Patent Application No. Hei 6-260455, a soft etching method of using a plasma processing apparatus with low bias voltage and at high density plasma as a method of pretreatment upon forming an upper conduction layer in a contact hole. According to this method, cleaning with less damages is possible by using $Ar^+$ ions at low energy. Further, a worry of etching rate reduction can be compensated with the improvement of plasma density.

However, in a present situation, in which the integration degree of a semiconductor device has further been increased and, for example, the thickness of the gate insulation film has been reduced to 10 nm or less and the depth of the impurity diffusion layer has also been made thinner, a cleaning method with less damages and higher stability is demanded. Further, severer cleaning is required in a case of forming the upper conduction layer with a high melting metal such as tungsten or a metal such as copper of low resistance by means of a CVD method or an electric field plating method in addition to sputtering of Al series metal.

Further, in a mass production line for semiconductor devices, when the number of processing batches is increased in a plasma processing apparatus for dry cleaning, conductive materials or organic materials removed by sputtering from the substrate to be processed are gradually deposited to the inner wall of the plasma processing apparatus. This lowers the insulation resistance value at the surface of the inner wall and makes actuation or continuation of plasma discharge instable if the resistance value is lowered to less than a predetermined level. As a result, this results in undesired effects on cleaning characteristics relative to the substrate to be processed, namely, etching off amount by the rare gas ions or scatterings thereof within the plane of the substrate to be processed and between the substrates to be processed, which results in lowering of yields of articles such as by increase of the contact resistance and instability thereof.

SUMMARY OF THE INVENTION

An object of the present invention is to solve the foregoing problems in the related art described above.

That is, it is an object of the present invention to provide a method of a manufacturing a semiconductor device using a cleaning step capable of stably forming a contact with low resistivity, high reliability and good reproducibility and giving less damages also in a semiconductor device to which a sub-quarter micron design rule is applied.

A method of manufacturing a semiconductor device according to the present invention has been proposed for attaining the foregoing object.

That is, a method of manufacturing a semiconductor device according to the present invention comprises a step of aperturing a contact hole in an interlayer insulation film formed on a conduction layer on a substrate to be processed, the hole being facing the conduction layer, a step of cleaning the surface of the conduction layer exposed to the bottom of the contact hole at least by a discharge plasma processing with a rare gas, and a step of forming continuously an upper conduction layer at least in the contact hole wherein the method comprises:

placing a dummy substrate constituted with an insulation film at least for the surface on a substrate stage of a plasma processing apparatus, applying at least a discharge plasma processing with a rare gas to the dummy substrate and then applying the cleaning step.

In the constitution described above, "continuously" means applying a step of forming an upper conduction layer in the next step, without exposing the substrate to be processed in an atmospheric air, within an identical plasma processing chamber or after transporting the same by way of a vacuum gate valve to a conduction layer forming apparatus.

In the step of applying at least a discharge plasma processing with a rare gas to the dummy substrate, it is preferred to sputter the insulation film on the surface of the dummy substrate thereby depositing an insulation film on the inner wall of the plasma processing apparatus.

The dummy substrate may be constituted with the insulation film only for a surface portion, or may be constituted with an insulation material as far as the inside.

In addition to the step of applying at least the discharge plasma processing with a rare gas to the dummy substrate, it is preferred to apply a discharge plasma processing with an oxygen-containing gas and applying an oxidizing processing to the inner wall of the plasma processing apparatus.

The plasma processing apparatus adopted in the present invention preferably has an insulation resistance monitoring device for the surface of the inner wall of the plasma processing apparatus, and applies at least a discharge plasma processing with a rare gas to the dummy substrate or applies an oxidizing processing to the inner wall of the plasma processing apparatus based on the insulation resistance information from the insulation resistance monitoring device.

As the rare gas used for the cleaning step, Ar used so far may be adopted but a dry pretreatment giving less damages can be applied by adopting Xe, Kr or Rn. A reducing gas such as $H_2$ may also be added to the rare gas.

Further, in any of the present inventions, it is desirable to use a plasma processing apparatus having a high density plasma generating source at a plasma density of $1 \times 10^{10}$ $cm^{-3}$ inclusive to $1 \times 10^{14}$ $cm^{-3}$ exclusive in the plasma processing step for cleaning and oxidizing treatment, and apply a substrate bias to the substrate to be processed, while setting the substrate bias potential at about 10 V to 300 V inclusive.

If the substrate bias potential is lower than 10 V, an effect of removing the spontaneous oxide films is insufficient or removal requires a long time, whereas damages given to the substrate to be processed are increased if it exceeds 300 V.

The plasma processing apparatus employed particularly suitably to the present invention can include, for example, an ICP (Inductively Coupled Plasma) processing apparatus, a TCP (Transformer Coupled Plasma) processing apparatus, a helicon wave plasma processing apparatus or an ECR (Electron Cyclotron Resonance) plasma processing apparatus. The apparatus described above have a high density plasma generating source at $1 \times 10^{11}$ $cm^{-3}$ or higher.

The apparatus capable of obtaining plasma density in the order of $1 \times 10^{10}$ $cm^{-3}$ can include, for example, a parallel plate plasma processing apparatus utilizing magnetron discharge.

If the plasma density is lower than $1 \times 10^{10}$ $cm^{-3}$, through put is somewhat lowered on the surface of an etching plate like that in existent parallel plate plasma processing apparatus.

Further, although the higher plasma density is desirable, the plasma density at $1 \times 10^{14}$ $cm^{-3}$ is approximately a limit value in the existent high vacuum plasma processing apparatus.

A plasma processing apparatus having the high density plasma generating source exemplified herein and further having a substrate bias power source capable of independently setting the substrate bias is desirable.

It is possible to apply cleaning with less damages while ensuring a through put, by conducting the rare gas plasma processing at high density plasma with low ion energy.

The operation will be explained below.

In a cleaning step before forming the upper conduction layer in interconnection of a multilayered wiring structure, the target for the cleaning is a substrate to be processed having a large occupying area ratio of an interlayer insulation film, that is, a silicon oxide series insulation film such as $SiO_2$. Accordingly, most of particles sputtered out by the rare gas discharge plasma processing comprises $SiO_2$, and conductive materials from the bottom of the contact hole, and organic materials such as etching residues or resist residues are also sputtered out as a portion of the particles.

Most of the sputtered conductive materials and the organic materials are removed by way of an exhaust hole of a plasma processing apparatus but a portion thereof is deposited to the inner wall of the plasma processing apparatus. Usually, the inner wall of the plasma processing apparatus is constituted with an insulating material such as quartz and, if the conductive materials or organic materials are deposited and accumulated thereon, the insulation resistance value at the surface of the inner wall is lowered to change the impedance of the plasma processing chamber, giving an effect on the discharge state of plasmas.

In the mass production apparatus, when the conductive materials and the organic materials are accumulated to the inner wall as the number of processing batches increases, impedance matching upon starting the plasma discharge is deviated from the initially set value and, depending on the case, it exceeds a range capable of being covered by an auto-tuning function of the plasma processing apparatus. Then, actuation or continuation of plasmas is no more possible.

Further, if plasmas could be actuated, the discharge state becomes instable to cause scattering in cleaning characteristics thereby increasing the fluctuation of contact resistance or the like to reduce the yield.

The problems described above becomes more conspicuous in high density plasma processing apparatus requiring tuning at high accuracy.

In the method of manufacturing the semiconductor device according to the present invention, a dummy substrate constituted with an insulation film such as $SiO_2$, at least for the surface is inserted on every predetermined number of batches, for example, on every article lot in a step of cleaning by the rare gas discharge processing and the rare gas discharging processing is applied in the same manner. Thus, materials of the insulation film are sputtered out from the surface of the dummy substrate and deposited on the inner wall of the plasma processing apparatus. Since the deposition products utterly consist of materials for the insulation film, they increase the resistance value at the surface of the inner wall of the plasma processing apparatus to restore the impedance of the plasma processing chamber to the vicinity of the initial set value.

Now, as the cleaning processing with a rare gas for the substrate to be processed and the plasma processing with a rare gas for the dummy substrate on every predetermined number of batches proceeded and deposition of the materials for the insulation film, the conductive materials or organic materials on the inner wall of the plasma processing apparatus proceeds, the plasma discharge state sometimes becomes instable gradually depending on the case. Then, in such a case, a discharge plasma processing with an oxygen gas is applied at a longer interval than that for the dummy substrate processing, for example, on every 10 lots.

By the oxygen plasma processing, organic products deposited to the inner wall of the plasma processing apparatus are removed by oxidizing combustion reaction, while the conductive materials are oxidized into insulation materials. As a result, it increases the resistance value at the surface of the inner wall of the plasma processing apparatus and restores the impedance of the plasma processing chamber again to the vicinity of the initially set value.

As described above, application of the rare gas plasma processing to the dummy substrate and periodical application of the oxygen plasma processing improves the yield in the cleaning step for the contact holes and in the step of forming the upper conduction layer to the contact hole in the mass production process, and a semiconductor device having low contact resistance can be manufactured stably.

On the other hand, a cleaning step for the contact hole at higher accuracy and a step of forming the upper conduction layer to the contact hole are enabled, by adopting a plasma processing apparatus having an insulation resistance monitor for the inner wall surface of the plasma processing apparatus, measuring the resistance value on every processed batch or optionally as required and applying a rare gas plasma processing for the dummy substrate or an oxygen plasma processing if the resistance value increases to higher than a setting value.

DETAILED DESCRIPTION OF THE PREFERRED EMBODIMENTS

The referred embodiments according to the present invention are to be explained with reference to the drawings.

Figure 1A:
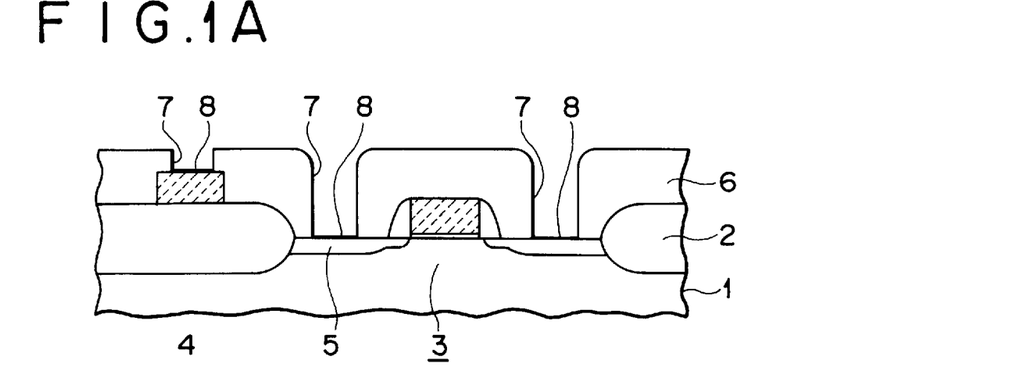
FIGS. 1A to 1C are schematic cross sectional views for explaining the steps of a method of manufacturing a semiconductor device according to the present invention.
Figure 1B:
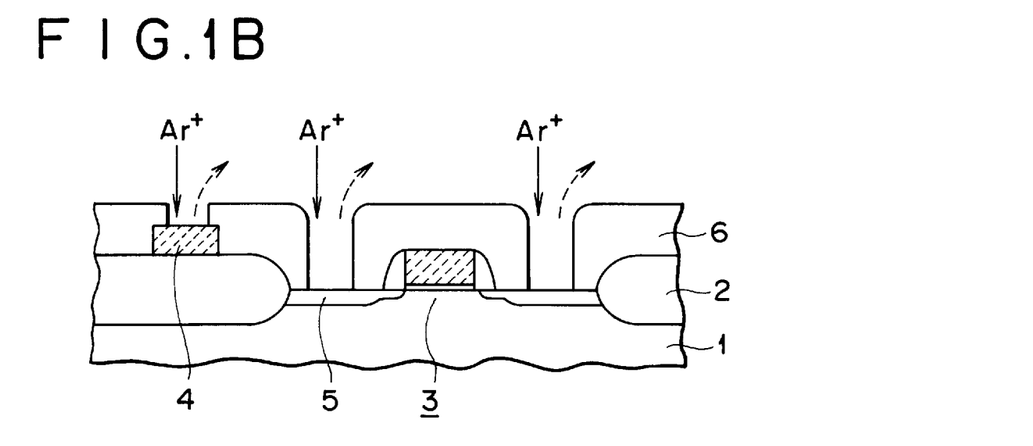
Figure 1C:
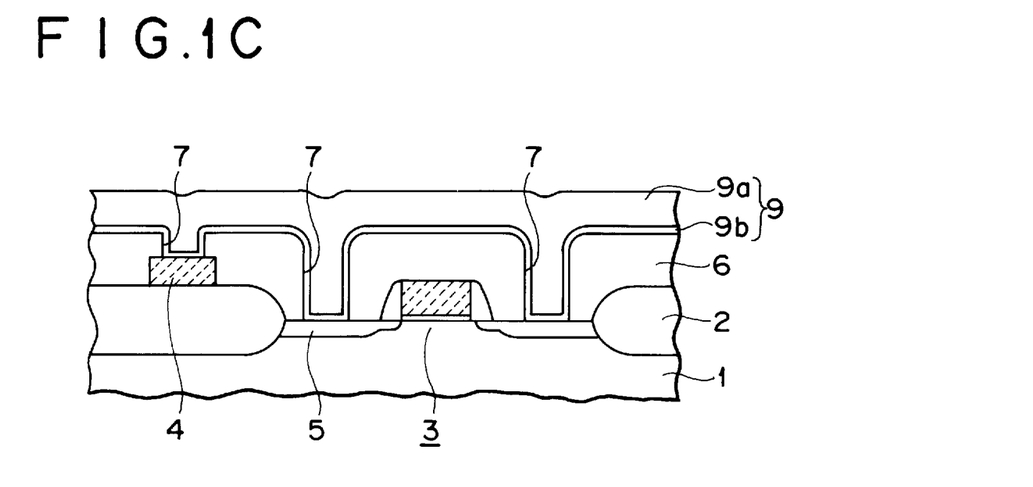

FIGS. 1A to 1C are schematic cross sectional views showing the steps for a main portion of a method of manufacturing a semiconductor device according to the present invention.

FIG. 1A shows a substrate to be processed before applying a cleaning step, the substrate including device isolation regions 2 formed on the surface of a semiconductor substrate 1, a gate electrode 3 and an impurity diffusion layer 5 formed within a region surrounded by the device isolation regions 2, and a contact hole 7 facing the impurity diffusion layer 5 and opened in an interlayer insulation film 6. Further, a lower layer wiring 4 is formed on the device isolation region 2 and a contact hole (via) 7 is opened facing the lower layer wiring 4.

Both of the impurity diffusion layer 5 and the lower layer wiring 4 constitute conduction layers.

Spontaneous oxide films 8 a re formed on the exposed surfaces of the conduction layers. As already described, the spontaneous oxide films 8 include a usual spontaneous oxide film and organic materials such as etching residues or resist residues, or reaction products formed in the step of forming the contact holes 7.

The spontaneous oxide films 8 should be removed, namely, cleaned by discharge plasma processing with a rare gas. In the present invention, discharge plasma processing with a rare gas for dummy substrates or oxidizing treatment to the inner walls of a plasma processing apparatus are applied on every predetermined number of batches in the cleaning step or based on insulation resistance information from an insulation resistance monitor.

FIG. 1B shows a cleaning step by the discharge plasma processing with a rare gas. The drawing schematically shows a state in which $Ar^+$ is incident to the substrate to be processed and particles such as of spontaneous oxide films at the bottom of the contact holes 7 are sputtered out. Actually, the surface of the interlayer insulation film 6 is also sputtered and constituent materials such as $SiO_2$ are also sputtered out (not illustrated). A portion of the sputtered out particles is deposited to the inner wall of the plasma processing apparatus to be described later.

As the rare gas, Xe, Kr, He or Rn may also be used in addition to usual Ar. Further, a reducing gas such as $H_2$ may also be added together with the rare gas.

FIG. 1C shows a state in which an upper conduction layer 9 is formed in contact with cleaned contact holes 7. The upper conduction layer 9 is formed continuously without exposing the cleaned substrate to be processed to the atmospheric air. The upper conduction layer 9 comprises a barrier layer 9b and a wiring layer 9a. The barrier layer 9b comprises a single layer or laminated layers of a high melting metal or a compound thereof such as Ti, TiN, Ti or $TiSi_2$. Further, the wiring layer 9a comprises polycrystal silicon, an Al series metal, a high melting metal such as W or Mo, or Cu.

FIG. 1C shows a structure in which a contact plug for filling the contact hole and the upper layer wiring extended on the interlayer insulation film 6 are integrated, but they may be made of different materials or formed separately. According to the present invention, interconnection with low resistivity can be attained stably even when the number of lots of the substrates to be processed is increased.

FIGS. 1A to 1C, the impurity diffusion layer 5 and the underlayer wiring 4 of the semiconductor substrate 1 have been explained as the conduction layer as an example. Alternatively, the upper layer wiring may be constituted as a conduction layer and a cleaning step may be applied to contact holes facing the upper layer wiring. Furthermore, a pad electrode exposed from the opening of a final passivation film may be constituted as the conduction layer, and cleaning may be applied to the pad electrode.

Then, examples for the constitution of plasma processing apparatus adopted in the method of manufacturing the semiconductor device according to the present invention are to be explained with reference to FIG. 2–FIG. 4.

Figure 2:
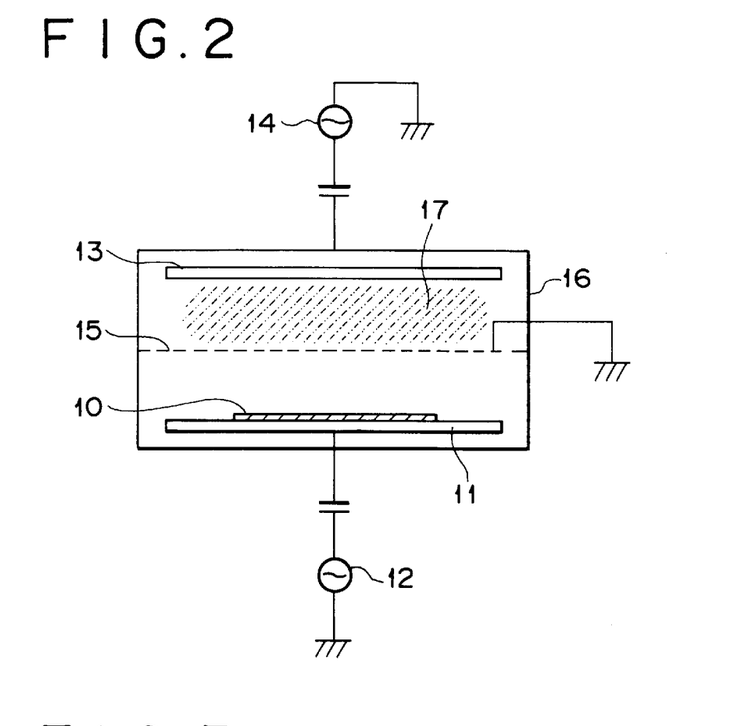
FIG. 2 is a schematic cross sectional view showing a triode parallel plate plasma processing apparatus used in embodiment 1.

FIG. 2 is a schematic cross sectional view of a triode parallel plate plasma processing apparatus. That is, in a plasma processing chamber 16, a substrate 10 to be processed is placed and a substrate stage 11 also serving as one of electrodes, a counter electrode 13 and a grid electrode 15 situated intermediate of parallel plate electrodes are disposed. The substrate stage 11 is connected with a substrate bias source 12 giving a substrate bias, and the counter electrode 13 is connected to a plasma forming power source 14 respectively, and the grid electrode 15 is grounded to an earth potential. In FIG. 2, details of the apparatus such as entry/delivery means of the substrate 10 to be processed into/out of the plasma processing chamber 16, a gas introduction nozzle, an exhaust port and a vacuum pump as are not illustrated. Further, a film deposition apparatus such as a sputtering apparatus for conveying a cleaned substrate 10 to be processed in vacuum and depositing an upper conduction layer continuously in subsequent steps are also not illustrated.

In the plasma processing apparatus shown in FIG. 2, plasmas 17 at an order of about $10^9$ cm$^{-3}$ are formed between the counter electrode 13 and the grid electrode 15, and ion incident energy from the plasmas 17 can be controlled independently by the substrate bias power source 12. That is, by a low substrate bias formed by the substrate bias power source 12, ions such as Ar$^+$ in the plasmas 7 are allowed to pass through the grid electrode 15 and incident to the substrate 10 to be processed and clean the surface thereof by sputtering. Most of the sputtered out particles comprise the material of the interlayer insulation film on the surface of the substrate 10 to be processed and also include the material of the conductive layer or organic materials at the bottom of the contact holes. A portion of them is deposited on the surface of the inner wall of the plasma processing chamber 16 to lower the insulation resistance value on the surface.

In the plasma processing apparatus shown in FIG. 2, plasma density at the order of $10^{10}$ cm$^{-3}$ can be obtained when it is constituted as a magnetron type parallel plate plasma processing apparatus utilizing magnetron movement of electrons in the plasmas 17 by disposing magnets at the back of the counter electrode 13 and the periphery of the plasma processing chamber 16.

Figure 3:
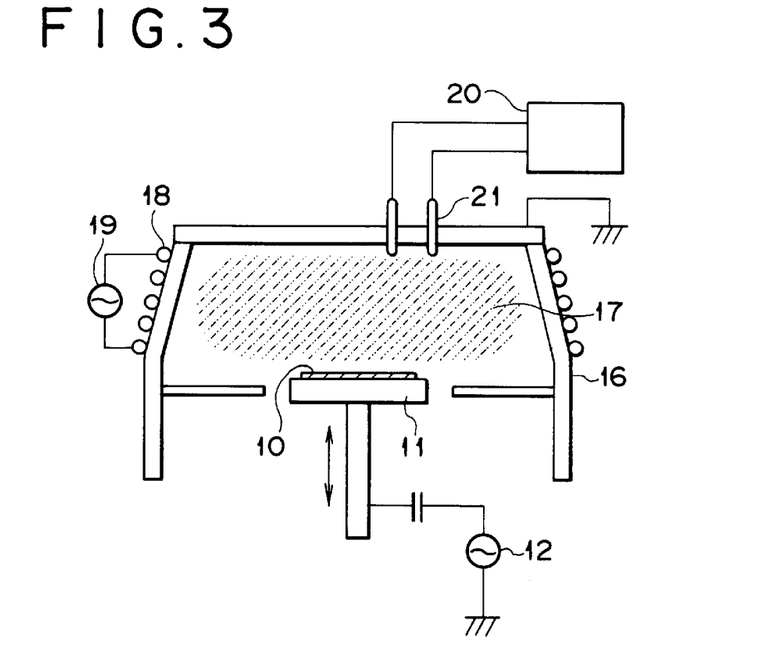
FIG. 3 is a schematic cross sectional view showing an inductively coupled plasma processing apparatus used in embodiment 2.
Figure 4:
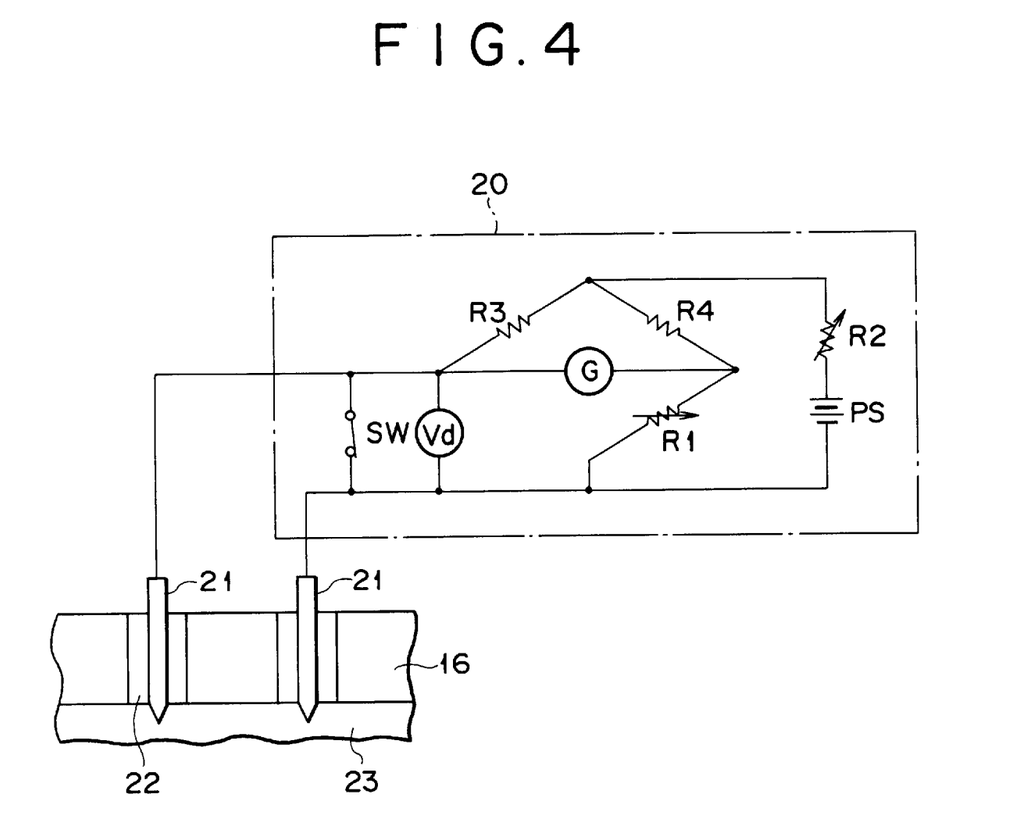
FIG. 4 is a view showing an outline of an insulation resistance measuring circuit for an inner wall of a plasma processing chamber.

FIG. 3 is a schematic cross sectional view showing the constitution of an inductively coupled plasma (ICP) processing apparatus. That is, a substrate stage 11 for placing a substrate 10 to be processed is disposed in a plasma processing chamber 16. The substrate stage 11 is connected to a substrate bias power source 14 for giving a substrate bias. Induction coupling coils 18 are wound in multiple turns around the plasma processing chamber 16, to which an ICP power source 19 is connected. Also in FIG. 3, details of the apparatus such as entry/delivery means for the substrate 10 to be processed into/out of the plasma processing chamber, a gas introduction nozzle, an exhaust port and a vacuum amp are not illustrated. Further, a film deposition apparatus such as a sputtering apparatus for transporting under vacuum a cleaned substrate 10 to be processed and depositing the upper conduction layer continuously is not illustrated.

The plasma processing apparatus shown in FIG. 3 has an insulation resistance measuring circuit 20. FIG. 4 shows details for the insulation resistance measuring circuit 20 and probe electrodes 21. Two probe electrodes 21 insulated with an insulation shield 22 are planted to the wall surface of the plasma processing chamber 16. Sputtered out particles are deposited as deposition products 23 along with cleaning of the substrate 10 to be processed to the inner wall surface of the plasma processing chamber 16. The insulation resistance value on the inner wall of the plasma processing chamber 16 is lowered by the deposition product 23, and a value is monitored as the insulation resistance value between the probe electrodes 21.

According to the plasma processing apparatus shown in FIG. 3, plasmas 17 of a high density at the order of $10^{11}$ cm$^{-3}$ or higher can be formed by alternating electric field formed by induction coupling coils 18. A great amount of rare gas ions such as Ar$^+$ in the plasmas 17 are incident to the substrate 10 to be processed by a weak substrate bias potential formed by the substrate bias power source 12 and clean the surface thereof.

According to the plasma processing apparatus shown in FIG. 2 or FIG. 3, the substrate to be processed can be cleaned under conditions giving less damages. Further, a dummy substrate constituted with an insulation material for the surface or the entire portion can be sputtered as the substrate 10 to be processed to deposit an insulation film on the inner wall of the plasma processing chamber 16. Further, by introducing an oxygen-containing gas and conducting plasma discharge, deposition products deposited on the inner wall of the plasma processing chamber 16 can be oxidized into insulative materials or removed by evaporation.

The insulation resistance measuring device 20 may be applied also to the triode parallel plate plasma processing apparatus shown in FIG. 2.

Embodiments

The present invention is to be explained more in details by way of embodiments. However, they are merely examples and the present invention are not restricted at all by the following embodiments.

Embodiment 1

This is an embodiment of cleaning spontaneous oxide films on the surface of a conduction layer exposed to the bottom of contact holes using discharge plasmas of a rare gas by a triode parallel plate plasma processing apparatus shown in FIG. 2, and the steps are explained again with reference to FIG. 1.

A substrate to be processed before the cleaning processing shown in FIG. 1A has the constitution described above in which a semiconductor substrate 1 comprise silicon single crystals, the interlayer insulation film 6 comprises SiO$_2$ and the gate electrode 3 and the lower wiring 5 comprises polycrystal silicon or high melting metal polyside respectively. The opening diameter of the contact hole 7 is about 0.24 μm and the thickness of the interlayer insulation film 6 is about 1.0 μm. Spontaneous oxide films are formed on the exposed surface of the gate electrode 3 and the lower layer wiring 4 as the conduction layer. In FIG. 1A, the spontaneous oxide films 8 are shown in a larger thickness than actual thickness for the sake of explanation.

In addition to the substrate to be processed as an article, a dummy substrate formed by thermally oxidizing a silicon substrate of an identical diameter to form an insulation film comprising SiO$_2$ at a thickness of 1 μm on the surface was provided as another substrate to be processed.

The dummy substrate as the substrate 10 to be processed was entered into the triode parallel plate plasma processing apparatus shown in FIG. 2, and set on the substrate stage 11. In the plasma processing apparatus, deposition products 23 were deposited on the inner wall surface of the plasma processing chamber 16 by the purifying processing for the substrate to be processed in the preceding lot as the article. Accordingly, actuation of plasmas or continuation of plasma discharge are instable in the state as it is.

Then, a discharge plasma processing with a rare gas was applied to the dummy substrate to sputter the insulation film on the surface under the following conditions.

[Sputtering Condition for Dummy Substrate]

| | |
|---|---|
| Ar | 25 sccm |
| Pressure | 0.7 Pa |
| Substrate stage temperature | 50° C. |
| Plasma forming power | 700 W (2 MHz) |
| Substrate bias voltage | 300 V (13.56 MHz) |
| Time | 60 sec |

By the sputtering, $SiO_2$ on the surface of the dummy substrate was sputtered out and a portions thereof was deposited on the inner wall surface of the plasma processing chamber 16. Sputtering for the dummy substrate for once may suffice and five dummy substrates were sputtered continuously in this example. After completing the sputtering, a thick $SiO_2$ was deposited on the inner wall surface of the plasma processing chamber 16. As a result, the insulation resistance value on the inner wall surface of the plasma processing chamber 16 was increased and plasma discharge can be maintained stably.

Subsequently, a substrate to be processed as an article shown in FIG. 1A was entered into the plasma processing chamber 16 and applied with discharge plasma processing with a rare gas under the following conditions to remove spontaneous oxide films 8. The plasma processing step could be applied in a stable state both for the actuation of plasmas and continuation of plasmas.

[Removing Condition for Spontaneous Oxide Films]

| | |
|---|---|
| Ar | 25 sccm |
| Pressure | 0.7 Pa |
| Substrate stage temperature | 50° C. |
| Plasma forming power | 700 W (2 MHz) |
| Substrate bias voltage | 200 V (13.56 MHz) |
| Time | 60 sec |

The substrate bias voltage is selected, for example, to about 10–300 V, preferably, about 50–250 V in order to suppress damages to the substrate to be processed.

In the step of removing spontaneous oxide films, that is, in the purifying step, the spontaneous oxide films 8 at the bottom of the contact hole 7 are sputtered out by irradiation of $Ar^+$ ions shown by solid arrows and they are removed as sputtered particles shown by dotted arrows as in FIG. 1B. Since the irradiation energy of $Ar^+$ ions in this example is a relatively low energy, there is less worry of giving damages to the substrate to be processed.

When the substrates to be processed as the article are cleaned, for example, by 10 sheets, the deposition products 23 are again deposited to the inner wall surface of the plasma processing chamber 16 to lower the insulation resistance value on the surface of the inner wall. Since actuation and continuation of the plasmas become unstable in this state, the dummy substrate is again sputtered to increase the resistance of the inner wall.

Now the thus cleaned substrate is conveyed under vacuum by way of a gate valve not illustrated into the sputtering apparatus and the upper conduction layer 9 is immediately formed. In this example, a barrier layer 9b at a thickness of 120 nm and a wiring layer 8a comprising W at a thickness of 600 nm were deposited as the upper conduction layer 9 by sputtering in this example. In the layer, the barrier layer 9b was formed as a three layered structure of Ti/TiN/Ti with the thickness for each of them as 30/60/30 nm. FIG. 1C shows a state of forming the upper conduction layer 9. Subsequently, the upper conduction layer 9 is etched to a desired wiring pattern or filled into the contact hole 7 by CMP (Chemical Mechanical Polishing) into the contact hole 7 to form a contact plug.

According to this example, since a sputtering step for the dummy substrate is inserted after cleaning a predetermined number of substrates to be processed, discharge plasma processing with a rare gas can be conducted always stably even after cleaning a plurality of substrates to be processed. Accordingly, interconnection with low resistivity can be formed stably even for a fine contact hole of a high aspect ratio.

Embodiment 2

This is an embodiment of applying a cleaning step while monitoring the insulation resistance value on the inner wall surface of a plasma processing chamber. The structure of the substrate to be processed as an article and a structure of the dummy substrate are identical with those in the previous Example 1, and duplicate explanations for the portions are omitted. An ICP process apparatus shown in FIG. 3 was employed as the plasma processing apparatus. The cleaning step is to be explained also with reference to FIG. 1.

The substrate to be processed adopting in this embodiment is identical with that explained for the previous embodiment 1 with reference to FIG. 1A, and duplicate explanations therefor are omitted.

A dummy substrate as a substrate 10 to be processed was entered into the ICP processing apparatus shown in FIG. 3 and set on the substrate stage 11. In the plasma processing apparatus, since the cleaning processing was applied for a plurality of substrate to be processed as the article, deposition products 23 were deposited to the inner wall surface of the plasma processing chamber 15 and the lowering of the surface insulation resistance was confirmed by the insulation resistance value measuring circuit 20. Accordingly, it may be a worry that actuation of plasmas and continuation of plasma discharge become instable in the state as it is.

Then, a discharge plasma processing with a rare gas was applied to the dummy substrate to sputter the insulation film on the surface under the following conditions.

[Sputtering Condition for Dummy Substrate]

| | |
|---|---|
| Ar | 30 sccm |
| Pressure | 0.13 Pa |
| Substrate stage temperature | 90° C. |
| ICP power | 1000 W (450 kHz) |
| Substrate bias voltage | 100 V (13.56 MHz) |
| Time | 60 sec |

By the sputtering, $SiO_2$ on the surface of the dummy substrate was sputtered out and a portions thereof was deposited on the inner wall surface of the plasma processing chamber 16. Sputtering only one the dummy substrate may suffice but five dummy substrates were sputtered continuously in this example. After completing the sputtering, a thick $SiO_2$ was deposited on the inner wall surface of the plasma processing chamber 16. As a result, the insulation resistance value on the inner wall surface of the plasma processing chamber 16 was increased and plasma discharge can be maintained stably.

However, depending on the thickness of the deposition products 23 or the contents of the deposition products 23 on the inner wall surface of the plasma processing chamber 16, the insulation resistance value on the inner wall surface of the plasma processing chamber 16 may not sometimes increased effectively only by the sputtering for the dummy substrate. In this case, discharge plasma processing with an oxygen gas was applied under the following conditions to apply an oxidizing processing to the inner wall of the plasma processing apparatus.

| [Condition for Oxidizing Processing] | |
| --- | --- |
| $O_2$ | 100 sccm |
| Pressure | 1.0 Pa |
| Substrate stage temperature | 90° C. |
| ICP power source power | 1000 W (450 kHz) |
| Substrate bias voltage | 0 V |
| Time | 180 sec |

By the oxidizing processing, organic materials in the deposition products 23 on the inner wall of the plasma processing chamber were vaporized and removed by oxidizing combustion reaction. Further, conductive materials in the deposition products 23 were oxidized and converted into insulative oxides. Accordingly, after the completion of the oxidizing processing, it was monitored by the insulation resistance measuring circuit 20 that the insulation resistance value at the inner wall surface of the plasma processing chamber 16 was increased and actuation and continuation of plasma discharge were stabilized.

Subsequently, a substrate to be processed as the article shown in FIG. 1A was entered into the plasma processing chamber 16 and applied with discharge plasma processing with a rare gas under the following conditions to remove spontaneous oxide films 8. The plasma processing step could be applied in a stable state both for the actuation of plasmas and continuation of plasmas.

| [Removing Condition for Spontaneous Oxide Films] | |
| --- | --- |
| Ar | 30 sccm |
| Pressure | 0.13 Pa |
| Substrate stage temperature | 90° C. |
| ICP power source power | 1000 W (450 kHz) |
| Substrate bias voltage | 80 V (13.56 MHz) |
| Time | 60 sec |

The substrate bias voltage is selected, for example, to about 10–300 V, preferably, about 50–250 V in order to suppress damages to the substrate to be processed.

In the step of removing the spontaneous oxide films, that is, in the purifying step, the spontaneous oxide films 8 at the bottom of the contact hole 7 are sputtered out by irradiation of $Ar^+$ ions shown by solid arrows and they are removed as sputtered particles shown by dotted arrows as in FIG. 1B. Since the irradiation energy of $Ar^+$ ions in this example is a relatively low energy, there is less worry of giving damages to the substrate to be processed.

When the substrates to be processed as the article are cleaned, for example, by 10 sheets, the deposition products 23 are again deposited to the inner wall of the plasma processing chamber 16 to lower the insulation resistance value on the surface of the inner wall. Since actuation and continuation of the plasmas become instable in this state, the dummy substrate is again sputtered or the oxidizing processing is applied as required to increase the resistance of the inner wall surface to the inner wall.

The procedures, after forming the upper conduction layer 9 shown in FIG. 1C, may be in accordance with those in Example 1.

According to this example, since the sputtering step for the dummy substrate and the oxidizing processing step for the inner wall of the plasma processing chamber are inserted after cleaning a predetermined number of substrates to be processed, discharge plasma processing with a rare gas can be conducted always stably even after cleaning a plurality of substrates to be processed. Accordingly, interconnection with low resistivity can be formed stably even for a fine contact hole of high aspect ratio.

The present invention has been explained specifically with reference to the two examples but the present invention is not restricted at all to such examples.

For example, as the plasma processing apparatus, an ECR plasma processing apparatus or a helicon wave plasma processing apparatus may be adopted in addition to the triode parallel plate apparatus or the ICP apparatus. With a view point of enabling cleaning with low ion energy, a high density plasma processing apparatus at an ion density of $1 \times 10^{11}$ $cm^{-3}$ or higher is used preferably.

While Ar was used in the purifying step by discharge plasma with a rare gas, other rare gas such as He, Xe, Kr, Rn or the like may also be used and, further, a reducing gas such as $H_2$ may also be added for use.

Further, the conduction layer on the substrate to be processed may be a semiconductor film or the like of a thin film transistor in addition to the impurity diffusion layer, the gate electrode and the wirings formed on the silicon substrate. Further, the semiconductor substrate may be made of a compound semiconductor such as SiGe or Ge or GaAs in addition to silicon.

In addition, it will be apparent that the constitution of the substrate to be processed or the like can be properly modified.

As has been apparent from the foregoing explanations, according to the method of manufacturing the semiconductor device of the present invention, spontaneous oxide films or etching residues can be removed stably with no damages to the conduction layer as the underlying material.

Accordingly, the interconnection structure with a contact hole of fine opening diameter and high aspect ratio can be provided with low resistance and high reliability.

What is claimed is:

1. A method of manufacturing a semiconductor device comprising:

aperturing a contact hole in an interlayer insulation film formed on a conduction layer on a first substrate to be processed, said hole facing said conduction layer;

placing a dummy substrate having an insulation film at least at a surface thereof on a substrate stage of a plasma processing apparatus;

applying at least a discharge plasma processing with a rare gas to said dummy substrate placed on said substrate stage;

after said application cleaning a surface of said conduction layer exposed at the bottom of said contact hole at least by a further discharge plasma processing with a rare gas in said plasma processing apparatus; and forming continuously an upper conduction layer at least in said contact hole.

2. A method of manufacturing a semiconductor device as claimed in claim 1, wherein said step of applying at least said discharge plasma processing with said rare gas to said dummy substrate comprises:

sputtering said insulation film on said surface of said dummy substrate; and depositing said sputtered insulation film to an inner wall of said plasma processing apparatus.

3. A method of manufacturing a semiconductor device as claimed in claim 1, wherein said method comprises:

prior to said step of cleaning said surface of said conduction layer, applying an oxidizing processing to an inner wall of said plasma processing apparatus by applying a discharge plasma processing of an oxygen containing gas.

4. A method of manufacturing a semiconductor device as claimed in claim 1, wherein said method comprises:

providing an insulation resistance monitoring device for monitoring an insulation resistance of the inner wall surface of said plasma processing apparatus;

obtaining insulation resistance information by monitoring said insulation resistance of said inner wall surface of said plasma processing apparatus; and wherein said application of at least said discharge plasma processing with said rare gas to said dummy substrate is based on said insulation resistance information from said insulation resistance monitoring device.

5. A method of manufacturing a semiconductor device as claimed in claim 3, wherein said method comprises:

providing an insulation resistance monitoring device for monitoring an insulation resistance of the inner wall surface of said plasma processing apparatus;

obtaining insulation resistance information by monitoring said insulation resistance of said inner wall surface of said plasma processing apparatus; and wherein said application of said oxidizing processing to said inner wall of said plasma processing apparatus is based on said insulation resistance information from said insulation resistance monitoring device.

6. A method of manufacturing a semiconductor device as claimed in claim 2, wherein said method comprises:

providing an insulation resistance monitoring device for monitoring an insulation resistance of the inner wall surface of said plasma processing apparatus;

obtaining insulation resistance information by monitoring said insulation resistance of said inner wall surface of said plasma processing apparatus; and wherein said application of at least said discharge plasma processing with said rare gas to said dummy substrate is based on said insulation resistance information from said insulation resistance monitoring device.

* * * * *